(12) United States Patent
Ivanov et al.

(10) Patent No.: US 10,655,214 B2
(45) Date of Patent: May 19, 2020

(54) METHOD OF MAKING A TANTALUM SPUTTER TARGET AND SPUTTER TARGETS MADE THEREBY

(71) Applicant: Tosoh SMD, Inc., Grove City, OH (US)

(72) Inventors: Eugene Y. Ivanov, Grove City, OH (US); Matthew Fisher, Columbus, OH (US); Alex Kuhn, Columbus, OH (US)

(73) Assignee: Tosoh SMD, Inc., Grove City, OH (US)

(*) Notice: Subject to any disclaimer, the term of this patent is extended or adjusted under 35 U.S.C. 154(b) by 225 days.

(21) Appl. No.: 15/560,733

(22) PCT Filed: Apr. 1, 2016

(86) PCT No.: PCT/US2016/025592
§ 371 (c)(1),
(2) Date: Sep. 22, 2017

(87) PCT Pub. No.: WO2016/164269
PCT Pub. Date: Oct. 13, 2016

(65) Prior Publication Data
US 2018/0080120 A1    Mar. 22, 2018

Related U.S. Application Data

(60) Provisional application No. 62/145,550, filed on Apr. 10, 2015.

(51) Int. Cl.
*C23C 14/34* (2006.01)
*C22C 27/02* (2006.01)
(Continued)

(52) U.S. Cl.
CPC .......... *C23C 14/3414* (2013.01); *B21B 1/024* (2013.01); *B21B 1/026* (2013.01);
(Continued)

(58) Field of Classification Search
CPC ....... C23C 14/3414; C22C 27/02; C22F 1/18; B21B 1/024; B21B 1/026; B21B 15/0007; H01J 37/3426
See application file for complete search history.

(56) References Cited

U.S. PATENT DOCUMENTS 5,778,302 A    7/1998 Ivanov
6,193,821 B1   2/2001 Zhang
(Continued)

FOREIGN PATENT DOCUMENTS

EP    0 902 102 A1    3/1999
WO    WO 00/31310 A1  6/2000
WO    WO 2010/051040 A1  5/2010

OTHER PUBLICATIONS

Pokross, "Controlling the Texture of Tantalum Plate", Journal of Metals, vol. 41, No. 10, pp. 46-49, Oct. 1989, Abstract.
(Continued)

*Primary Examiner* — Jessee R Roe
(74) *Attorney, Agent, or Firm* — Wegman Hessler

(57) ABSTRACT

Methods for making Ta sputter targets and sputter targets made thereby. Ta ingots are compressed along at least two of the x, y, and z dimensions and then cross rolled in at least one of those dimensions. A pair of target blanks is then cut from the cross rolled ingot. The resulting targets have a predominate mix of {100} and {111} textures and have reduced B {100} and B {111} banding factors.

12 Claims, 5 Drawing Sheets

(51) Int. Cl.
  *B21B 1/02* (2006.01)
  *B21B 15/00* (2006.01)
  *C22F 1/18* (2006.01)
  *H01J 37/34* (2006.01)

(52) U.S. Cl.
  CPC .......... *B21B 15/0007* (2013.01); *C22C 27/02* (2013.01); *C22F 1/18* (2013.01); *H01J 37/3426* (2013.01); *B21B 2015/0014* (2013.01); *B21B 2015/0021* (2013.01)

(56) References Cited

U.S. PATENT DOCUMENTS

| | | | |
|---|---|---|---|
| 6,348,113 B1* | 2/2002 | Michaluk | C22B 34/24 |
| | | | 148/423 |
| 6,348,139 B1 | 2/2002 | Shah et al. | |
| 6,976,380 B1 | 12/2005 | Hartwig, Jr. et al. | |
| 7,081,148 B2 | 7/2006 | Koenigsmann et al. | |
| 7,101,447 B2 | 9/2006 | Turner | |
| 7,228,722 B2 | 6/2007 | Spreckelsen et al. | |
| 7,716,806 B2 | 5/2010 | Oda | |
| 7,832,619 B2 | 11/2010 | Butzer et al. | |
| 8,231,745 B2 | 7/2012 | Wickersham, Jr. et al. | |
| 8,500,928 B2 | 8/2013 | Matera et al. | |
| 9,017,493 B2 | 4/2015 | Hagihara et al. | |
| 2005/0252268 A1* | 11/2005 | Michaluk | C22F 1/18 |
| | | | 72/365.2 |
| 2010/0136313 A1* | 6/2010 | Shimizu | C01B 33/00 |
| | | | 428/220 |
| 2011/0214987 A1 | 9/2011 | Holcomb et al. | |
| 2012/0328468 A1 | 12/2012 | Kumagai et al. | |
| 2014/0134037 A1 | 5/2014 | Chen | |

OTHER PUBLICATIONS

Morris et al., "A New Composite-Sample Method for Orientation-Distribution Analysis", Textures and Microstructures, vol. 19, pp. 1-8, 1992.
Michaluk, "Correlating Discrete Orientation and Grain Size to the Sputter Deposition Properties of Tantalum", Journal of Electronic Materials, vol. 31, Issue 1, pp. 2-9, 2002, Abstract.
Sandim et al., "Recrystallization of Oligocrystalline Tantalum Deformed by Cold Rolling", Materials Science and Engineering, vol. 392, Issues 1-2, pp. 209-221, Feb. 2005, Abstract.
Blobaum et al., "Materials Characterization of Tantalum for High Energy Density Targets", Lawrence Livermore National Laboratory, 28 pages, May 24, 2012.
Deng et al., "Texture Evolution of High Purity Tantalum Under Different Rolling Paths", Journal of Materials Processing Technology, vol. 214, Issue 2, pp. 462-469, Feb. 2014, Abstract.
International Search Report and Written Opinion dated Jul. 12, 2016 for PCT/US2016/025592 filed Apr. 1, 2016.
International Preliminary Report on Patentability dated Oct. 19, 2017 for PCT/US2016/025592 filed Apr. 1, 2016.

* cited by examiner

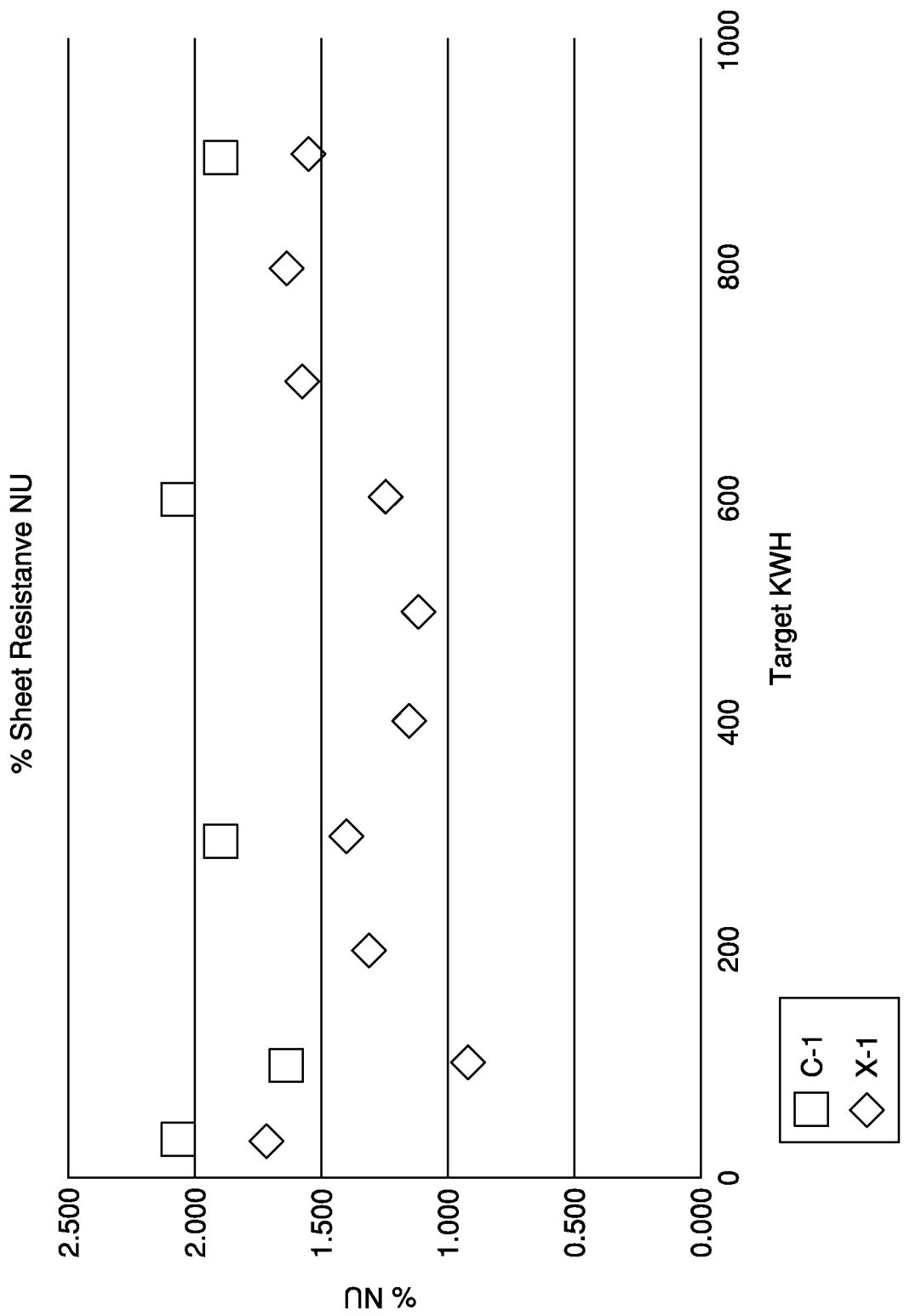

METHOD OF MAKING A TANTALUM SPUTTER TARGET AND SPUTTER TARGETS MADE THEREBY

CROSS-REFERENCE TO RELATED APPLICATION

This application claims the priority filing benefit of International PCT Application PCT/US2016/025592 filed Apr. 1, 2016 and published under PCT 21 (2) in the English language, U.S. Provisional Patent Application Ser. No. 62/145,550 filed Apr. 10, 2015. Each of the above listed applications is incorporated herein by reference.

FIELD OF INVENTION

The present invention relates to BCC metal and BCC metal alloy sputter targets and to methods of making same wherein banding at target mid-thickness is reduced compared to prior art methods. This invention yields a Ta sputtering target that improves film thickness uniformity, which in turn reduces variation in sheet resistance.

BACKGROUND

Conventional Ta and other BCC metal targets display bands of $\{111\}$ and $\{100\}$ crystallographic orientation proximate the mid-thickness target area. These bands lead to substrate non-uniformity upon sputtering, through the life of the target.

SUMMARY OF THE INVENTION

In one exemplary aspect of the invention, a BCC metal or BCC metal alloy target is prepared. An ingot of the target is provided with the ingot having a generally cylindrical configuration and having x, y, and z dimensional directions. The ingot is compressed in at least two of these dimensional directions and cross rolled in at least one of the dimensional directions. The resulting ingot is cut perpendicular to a first of the dimensional directions and parallel to a second of the dimensional directions to form at least a pair of target blanks. Each of the target blanks is then cross rolled.

In one exemplary embodiment, the ingot is compressed in the y and z directions and then the ingot is cut into a pair of target blanks by cutting perpendicular to the z direction and parallel to the y direction. In some embodiments, the compressing step may comprise forging. In other embodiments, this forging may be conducted in the x, y, and z dimensional directions thereby defining tri-axial forging.

In other embodiments of the invention, the BCC metal is Ta or Ta alloy. Sputter targets comprising Ta metal or Ta alloy are thus provided, and these targets have a thickness dimension and a purity of at least 99.5% and a combined C, O, N, H content of less than about 25 ppm. The Ta metal or metal alloy may have a grain size of from about 50 to 100 microns and a mixed texture with substantially no gradient throughout the mid-fraction of the thickness dimension.

In some embodiments, the sputter target may have a C, O, N, H content of less than 25 ppm, and the grain size is from about 50 to 150 microns. In some embodiments, the sputter target has a purity of 99.995% or greater. The targets may be characterized by having a predominant mix of $\{100\}$ and $\{111\}$ textures, and the target has reduced $\{100\}$ and $\{111\}$ banding factors wherein each of the B $\{100\}$ and B$\{111\}$ banding factors is less than 5.00%.

In other embodiments, the banding factors B $\{100\}$ and B $\{111\}$ are less than about 4.00%. In certain exemplary embodiments, the target has a $\{100\}$ mole fraction of about 30% and a $\{111\}$ mole fraction of about 27%.

BRIEF DESCRIPTION OF THE DRAWINGS

FIG. 4 is a graph showing percentage of non-uniformity of films sputtered at various target power outputs for a comparative sputter target C-1 and a target made in accordance with the invention X-1.

DESCRIPTION OF THE INVENTION

Figure 1A:
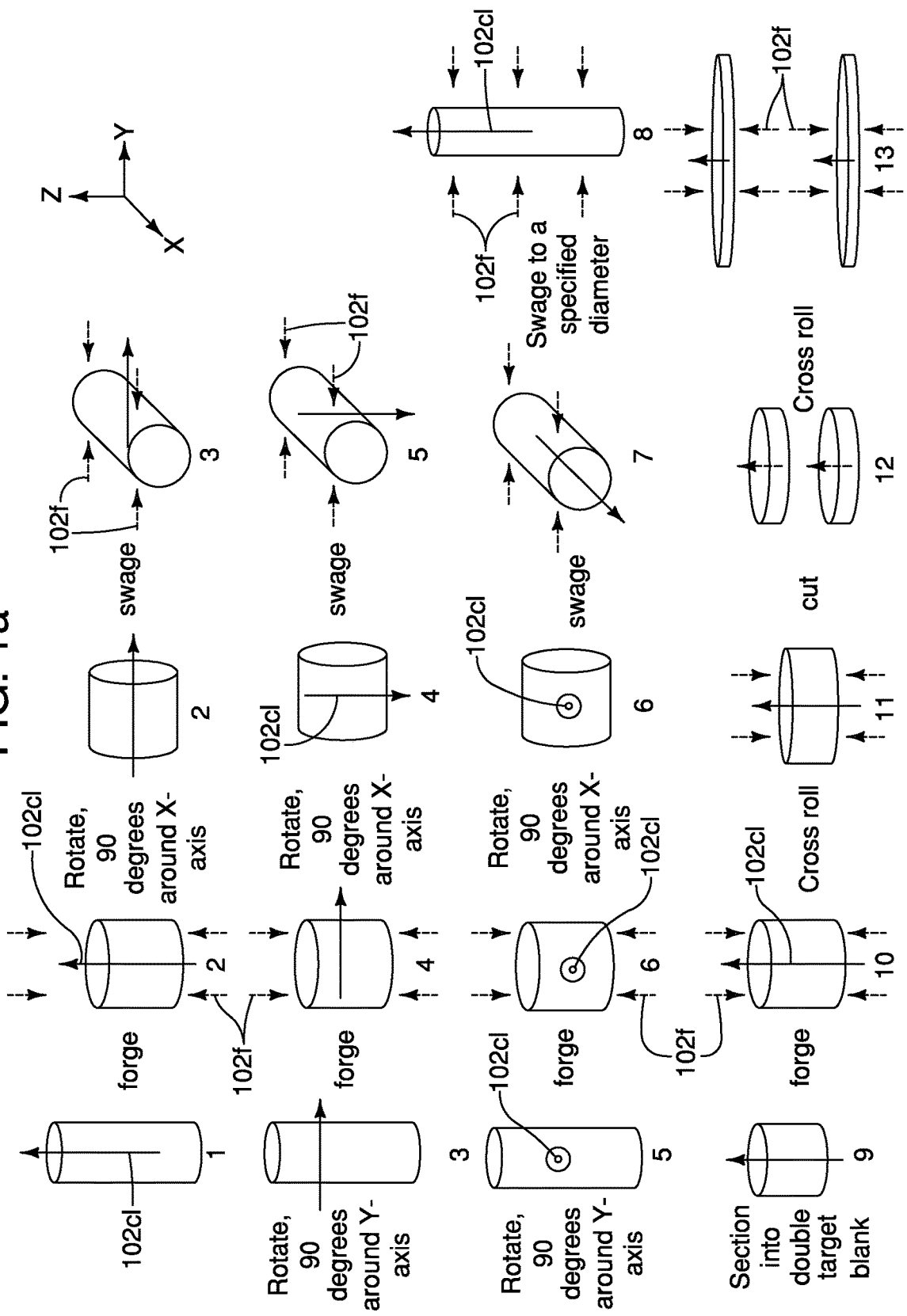
FIG. 1a is a schematic process diagram showing one exemplary manufacturing scheme in accordance with the invention.

In one embodiment of the invention, an ingot of Ta or Ta alloy or other BCC metal is obtained. In one embodiment, as shown in FIG. 1a, the ingot is e-beamed melted and subjected to vacuum arc melting. The centerline of the ingot is defined as the central z-axis of the original ingot. The billet is turned by 90 degrees about the x-axis during each the tri-axial forging step. This tri-axial forging can be repeated several times, in each of them the height is reduced, and then the billet is swaged back to its original diameter with the height increasing along the x-axis. After each swaging step, the billet axis is turned another 90 degrees about the y-axis. The ingot is then vacuum annealed and followed by a cutting step to produce a double target blank, whose weight is approximately 2.2 times the final target weight (i.e., the double blank itself weighs about 2.2× a final target weight). The target double blanks may be upset forged and clock rolled. During the upset forging and clock rolling, the center line of the ingot is maintained in the center of the ingot and parallel to the compressive forces used during fabrication. After the first clock rolling step, the target double blank is cut in half perpendicular to the ingot centerline and parallel to the target blank surface. The resulting two pieces are subjected to an additional clock rolling step, followed by a final vacuum anneal. This processing results in near net shape blanks for usage as a sputter targets.

As shown in FIG. 1a, the starting ingot 1 with a central ingot axis along the z-axis is upset forged parallel to the central axis to a specific height to form billet 2, which is then rotated 90 degrees about the x-axis. Billet 2 is swaged back to original diameter of ingot 1, to give billet 3. Compressive forces used to swage billet 3 are along the y-axis, parallel to the central ingot axis. The process above is repeated two more times to yield billet 7, with the original dimensions and the same central ingot axis as ingot 1. Billet 7 is then swaged, with compressive forces along the y-axis, with increasingly smaller dies to a specified diameter to yield billet 8. This forging in the x, y, and z directions of the billet is referred to as "tri-axial" forging. The black arrows in FIG. 1 indicate the central ingot axis; the red arrows indicate the direction of the compressive forces used to create the current ingot morphology. The resulting billet 8 is sectioned into double target blanks, upset forged and cross or clock rolled as shown at 10 and 11, with compressive forces along the z axis. Then the billet is cut perpendicular to the z axis and parallel to the y axis as shown at 12, followed by cross rolling of each resulting billet half as shown at 13. The resulting two pieces are subjected to a final vacuum anneal.

Figure 1B:
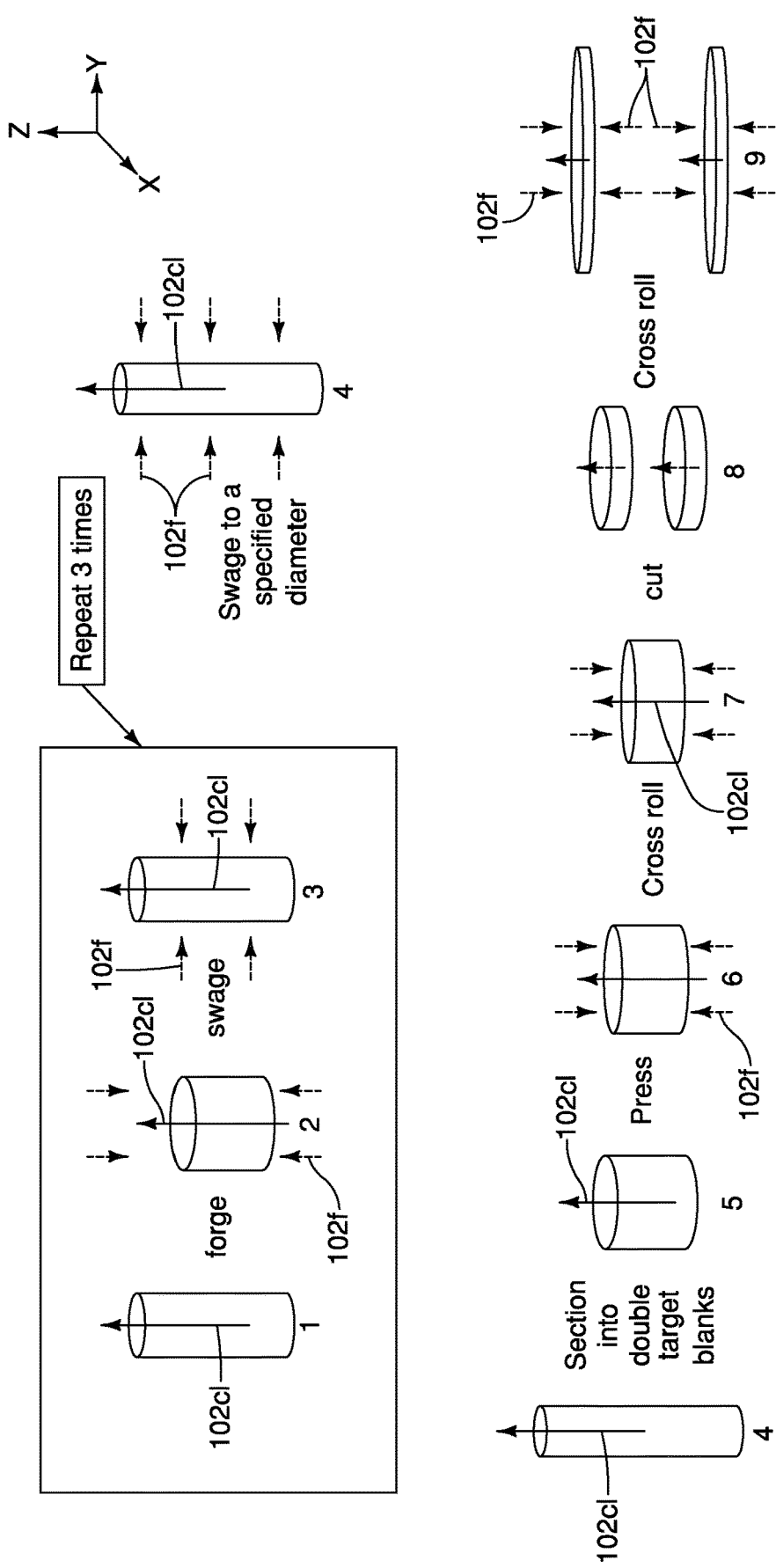
FIG. 1b is a schematic process diagram showing another exemplary manufacturing scheme in accordance with the invention.

FIG. 1b shows another embodiment in which the billet is forged in two directions: y and z. Here, the billet is upset forged along the z axis as shown by the red arrows around billet 2. Billet 2 is swaged back to the original diameter of ingot 1 to give billet 3. Compressive forces used to swage billet 3 are along the y-axis, perpendicular to the central ingot axis. This process is repeated three times to give billet 3. Billet 3 is then swaged, with compressive forces along the y-axis, with increasingly smaller dies to a specified diameter to yield billet 4. The resulting billet 4 is sectioned into double target blanks, upset forged and cross or clock rolled as shown at 6 and 7, with compressive forces along the z axis. Then, the billet is cut perpendicular to the z axis and parallel to the y axis as shown at 8, followed by cross rolling of each resulting billet half as shown at 9. The resulting two pieces are subjected to a final vacuum anneal. In FIGS. 1a and 1b, dot dash arrows 102f indicate direction of force, and the solid line arrows 102cl represent the ingot centerline. For purposes of simplification, only some of the arrows have reference numerals applied thereto.

It is apparent then that in accordance with both embodiments 1a, and 1b, a Ta or Ta alloy (or BCC metal or alloy) target is prepared by providing a generally cylindrical billet having an x direction, a y direction perpendicular to the x direction, and a z direction perpendicular to the plane defined by vectors extending in the x and y direction. The billet is then compressed along at least two of these three directions. Recrystallization annealing may be performed between each forging step and is preferably conducted after each swaging step and after the final cross or clock rolling steps.

Both of the FIGS. 1a and 1b embodiments result in at least a pair of near net target shape blanks that may be used as suitable sputter targets after appropriate final machining and/or polishing steps. Ta and Ta alloy targets are provided wherein the Ta is at least 99.5% pure and has an interstitial content (C, O, N, H) of less than about 25 ppm. Ta targets in accordance with the invention have a uniform grain size of about 50-100 microns and a mixed homogenous {100}/{111}/{110} texture throughout the thickness of the blank.

Figure 2:
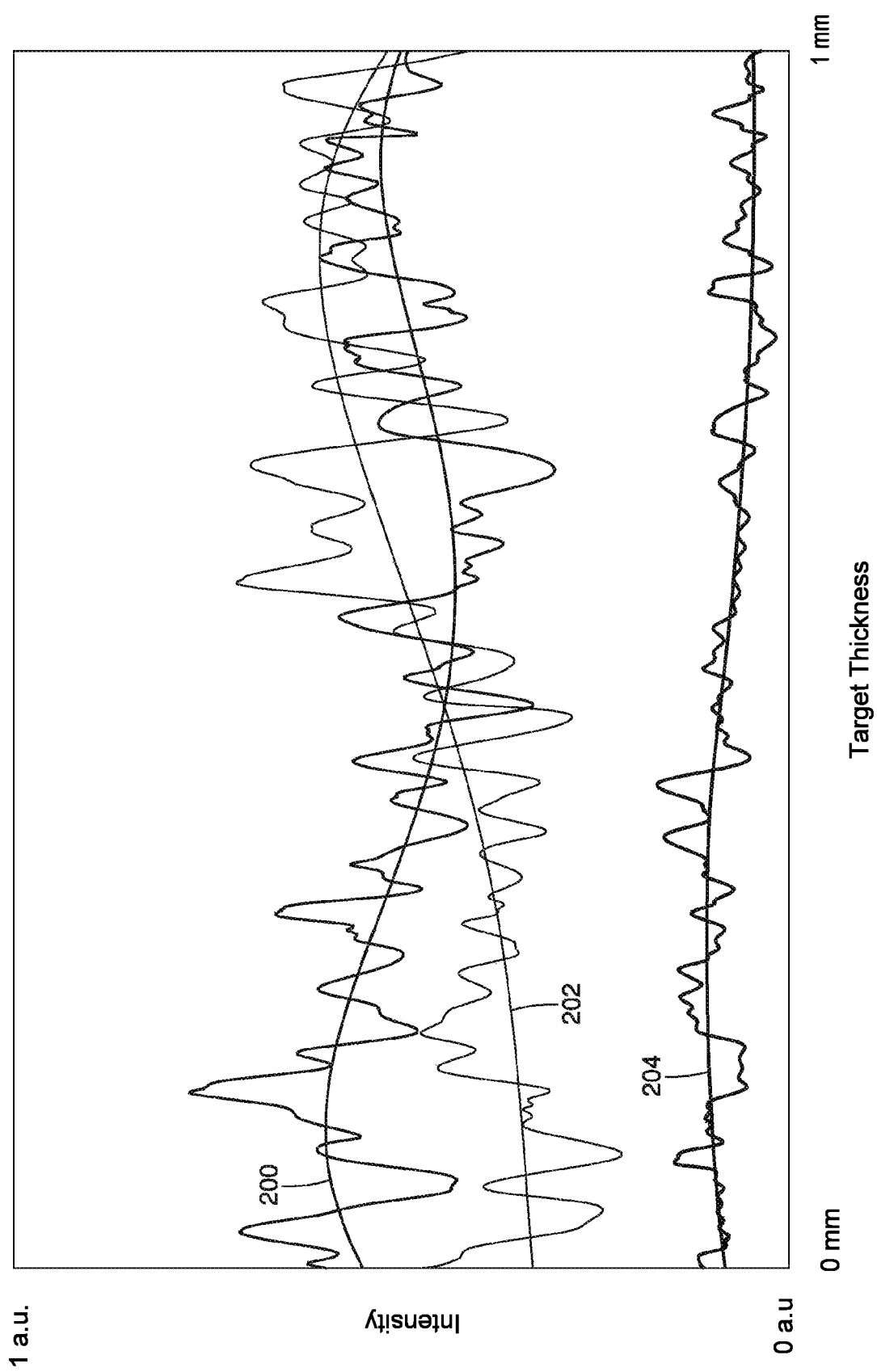
FIG. 2 is a graph showing through target texture of one sputter target in accordance with the invention. In the graph, the x direction represents target thickness with the y direction showing the amount of a given crystallographic orientation present at particular target thickness locations.

The texture of one target in accordance with the invention is shown in FIG. 2. Here, the x direction of the graph represents target thickness with the y direction representing the amount of crystallographic orientation present at the particular target thickness locations. The line 200 depicts {100} texture, line 202 depicts {111} texture and line 204 represents {110} texture. In FIG. 2, the mole fraction of {100} is 0.300, {111} is 0.278, and {110} is 0.046. (Each of these is multiplied by 100 to establish mole % present). The banding factor B is B {100}3.616% and B {111} 4.138%. Banding factors of less than about 5.00%, for each of the {100} and {111} are beneficial with B factors of less than about 4.50% being even more preferred. The average B {100} and B {111} banding for the target is 3.877%, with an average B {100} and B {111} banding factor of less than about 4.50 being considered as beneficial. Thus, this target exhibits a predominate mix of {100} and {111} with substantially no banding. {110} is present in a small amount.

The thin film formed by sputtering targets produced in accordance with this invention, have a variation in film thickness uniformity (percent non-uniformity) 3.000% or less, and more preferably 2.000% or less. See FIG. 4. Furthermore, the thin film formed by sputtering targets produced in accordance with this invention, have a variation in sheet resistance, within wafers, and between wafers, 4.00% or less, and more preferably 3.00% or less.

One target produced in accordance with the invention had exemplary sputtering performance, as exhibited in FIG. 4. This target had a banding factor B {100} 3.798% and B {111} 4.126%, with an average B {100} and B {111} of 3.962%. This target exhibited an average percent (for the resulting sputtering film) non-uniformity of 1.447%, achieving as low as 0.928% through the life of the target. The percent variation in sheet resistance within wafers was 2.61% on average, achieving as low as 1.77%. It is clear that a sputtering target with a banding factor less than 5.00% for both {100} and {111} textures produces exemplary thin film properties.

Figure 3:
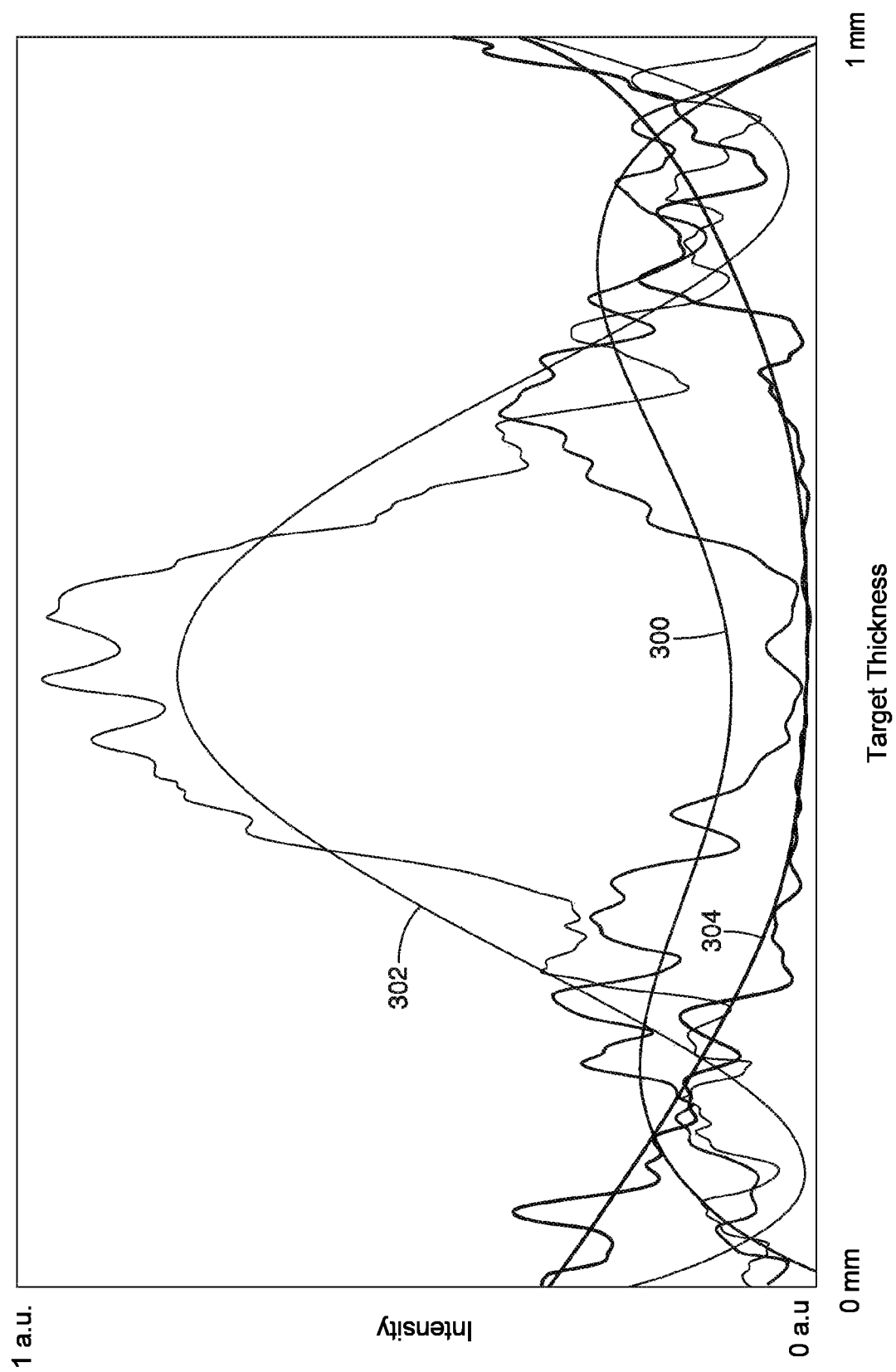
FIG. 3 is a graph similar to that shown in FIG. 2 except that this figure illustrates through target texture of a target prepared via a prior process.

FIG. 3 represents the texture of a conventionally processed Ta target in accord with the prior art. Line 300 represents {100} texture; line 302 represents {111} texture; and line 304 represents {110} texture. Here the {100} mole fraction is 0.163 and {111} is present in an amount of 0.359. {110} is present in an amount of 0.107. Banding is significant: B {100}=6.039% and B {111}=8.80%.

The Ta targets in accordance with the invention exhibit predominate mixed {100} {111} texture, i.e., both {100} and {111} textures, when combined, equal greater than 50% mole fraction (based on 100% mole fraction), and the targets banding factors B {100} and B {111} are each less than 5.00%. Methods for determining mole fractions of textures present and banding factors are detailed in published U.S. Patent Application 2011/0214987, incorporated by reference herein.

Recrystallization annealing steps of about 900-1300° C. may be performed at various times throughout the process and, for example, may be performed under vacuum conditions after the final clock rolling steps (e.g., workstations 13 and 9 in FIGS. 1a and 1b) and prior to or between the other compression steps of the process. The various cross roll or clock rolling steps may in some embodiments result in about 70% area reduction.

Preferably, the BCC metal is Ta, although Nb can also be mentioned. Ta/Nb alloys may also be treated by the process.

With regard to quantification of texture components, variation through thickness, a method was cooperatively developed by leading tantalum sputter plate suppliers and users that allows the features to be measured independent of one another. In rolled tantalum plate, the texture is nominally symmetrical about its mid-thickness center line and each half (upper and lower) can be analyzed separately and compared. The through thickness sample is measured in an SEM with Electron Back Scattered Diffraction capability and a two dimensional map is collected as an EBSD data file. The 'as-measured' orientation is in the transverse plan and each data point is rotated to show the texture in the plate normal orientation (ND). Each data point has a texture orientation and individual grains can be indexed. The pixel by pixel data is used in the following analysis.

The original EBSD data can be converted from multi color maps representing all possible textures to three primary colors. The primary colors were chosen because they show up in equal contrast in a display. Any points that did not index within a 15° cut-off for the three textures being analyzed are presented as the color gray and do not count in the volume fraction of analyzed textures (Ftotal).

For calculation, the entire data set is broken into thin slices perpendicular to the x direction (thickness direction). The crystallographic texture is averaged (over the y direction) in each slice. The width of each slice is the x-step distance. It is specified as an integer multiple (n-step) of the minimum e-beam stepping increment in the x direction used to create the pixel map. Usually an n-step of 1 is used. It can be larger if the e-beam stepping distance was set very small compared to the grain size. The EBSD step size should be set to about ⅓ the average linear intercept (ASTM E112 Grain Size method). The analysis area should be at least 100 steps wide (RD rolling direction).

The strengths of the components (100//ND and 111//ND are normally the two major components in tantalum plate) are measured as the area percentage of each half thickness, using a 15 cut-off. For the analysis of a two dimensional EBSD map, only three texture components are analyzed: {100}, {110}, and {111}. Four arrays (each of length n-count) are needed to receive the data from the EBSD input file, i.e., F100, F110, F111, and Ftotal. For each point in the pixel map, the x-location (thickness direction) determines the index location for updating calculation arrays:

$$\text{Index} = \frac{\text{'x} - \text{location}}{\text{'x} - \text{step'}} + 1$$

The Euler angles $\Phi$ and $\Phi_2$ determine the location of the target surface normal (Nt) within orientation space. These two angles, respectively, can range from 0 to 90°. and from 0 to 360°. For each pixel in the data file, it is necessary to calculate the angle of Nt with each orientation direction for the relevant texture components. For the three components, there are 26 angles to calculate. By applying crystal symmetry operations, the ranges for $\Phi$ and $\Phi_2$ can be reduced. The smallest angle found determines the texture component 'candidate'. That angle is compared to the "cut-off" angle— chosen as 15°. If the angle is less than the "cut-off" angle the candidate array is incremented (i.e., F100(index)=F100(index)+1). The total count array is increments (Ftotal(index)=Ftotal(index)+1).

Once the calculation for all of the pixel data points has been completed as outlined above, the volume fraction of the texture component has been calculated as a function of depth direction (x) with a depth resolution of x-step.

Each texture component is analyzed by moving the window across the analysis area and collecting the F(hkl) in each window. The value of F(hkl) is plotted by the location (center of the window). The data can be smoothed by creating a band or window larger than x-step and averaging the volume components within the band or window. The volume fraction data is plotted as the average value within the band at each x step location.

Once the area fractions F(hkl) are known from each window location, the data can be fitted to a line using a least squares method (linear regression). The slope of the line is the texture gradient with units of area fraction/distance (%/mm). The gradient must be calculated for only the half thickness. Both halves of the sample can be measured to determine the symmetry of the plate.

For banding, the F(hkl) lines can be fit to a polynomial of order 4 or less and the average deviation of the data to the polynomial (absolute value of the difference) is used as the banding severity number. The polynomial accounts for the non-linearity of the gradient and avoids over estimating the banding as a result. Noise is also an issue with the banding calculation.

In an EBSB analysis, a very small number of grains are analyzed compared to traditional X-ray diffraction texture analysis of individual planes (thousands versus millions). The relatively low number of grains available for the analysis results in a low signal to noise ratio. To estimate the noise level, random textures can be assigned to all the points in the analysis grid (all EBSD points) and the same analysis completed. A banding number greater than zero will be the result. By running the noise calculation multiple times, an average random noise can be determined and compared to the result from the actual data set. The EBSD measurement method is powerful but time consuming. To accumulate data from the same number of grains as traditional XRD would be impractical. To aid in the analysis, a computer program can be written to automatically do the calculations from the EBSD data file and provide the results in graphical form. Such a program was created and made available to the members working together to develop the method.

Having described the invention by reference to various exemplary embodiments thereof, it will be apparent that modifications and variations are possible without departing from the scope of the invention defined in the appended claims.

The invention claimed is:

1. A method of making a BCC metal or BCC metal alloy sputter target comprising the steps of
   a) providing an ingot, said ingot having a generally cylindrical configuration and having an x, y and z dimensional direction,
   b) compressing said ingot in at least two of said dimensional directions,
   c) cross rolling said ingot along at least one of said dimensional directions,
   d) cutting said ingot resulting from said step (c) perpendicular to a first of said dimensional directions and parallel to a second said dimensional directions to form at least a pair of target blanks, and
   e) cross rolling each of said target blanks.

2. The method as recited in claim 1, wherein said at least two dimensional directions in step b are the y and z directions, and in step (d) said first dimensional direction is the z direction and the second dimensional direction is the y direction.

3. The method as recited in claim 1, wherein said step b comprises, forging, swaging or extrusion.

4. The method as recited in claim 1, wherein said step (b) comprises forging.

5. The method as recited in claim 4, wherein said forging is conducted in the x, y and z dimensional directions thereby defining tri-axial forging.

6. The method as recited in claim 1, wherein said BCC metal is Ta or Ta alloy.

7. The method as recited in claim 6 wherein said target has a predominate mix of {100} and {111} textures and has reduced {100} and {111} banding factors wherein each of the B {100} and B {111} banding factors is less than 5.00%.

8. The method as recited in claim 7, wherein the average of B {100} and B {111} is less than about 4.00%.

9. The method as recited in claim 7 wherein B {100} and B {111} are each less than 4.50%.

10. The method as recited in claim 9, wherein said Ta has a purity of 99.5% and greater, and a uniform grain size of about 50-100 microns.

11. The method as recited in claim 10, wherein said target has a {100} mole fraction of about 30%.

12. The method as recited in claim 10, wherein said target has a {111} mole fraction of about 27%.

* * * * *